(12) United States Patent
Kitamura

(10) Patent No.: US 9,605,410 B2
(45) Date of Patent: Mar. 28, 2017

(54) HYBRID WORK MACHINE AND METHOD OF CONTROLLING AUTO-STOP OF ENGINE FOR THE SAME

(71) Applicant: KOMATSU LTD., Tokyo (JP)

(72) Inventor: Kenichi Kitamura, Kanagawa (JP)

(73) Assignee: Komatsu Ltd.

( * ) Notice: Subject to any disclaimer, the term of this patent is extended or adjusted under 35 U.S.C. 154(b) by 182 days.

(21) Appl. No.: 14/352,772

(22) PCT Filed: Jul. 23, 2013

(86) PCT No.: PCT/JP2013/069947
§ 371 (c)(1),
(2) Date: Apr. 18, 2014

(87) PCT Pub. No.: WO2015/011787
PCT Pub. Date: Jan. 29, 2015

(65) Prior Publication Data
US 2015/0032314 A1    Jan. 29, 2015

(51) Int. Cl.
*E02F 9/20* (2006.01)
*B60K 6/28* (2007.10)
(Continued)

(52) U.S. Cl.
CPC ............. *E02F 9/2091* (2013.01); *B60K 6/28* (2013.01); *B60K 6/485* (2013.01); *B60W 10/06* (2013.01); *B60W 20/10* (2013.01); *E02F 9/123* (2013.01); *E02F 9/2075* (2013.01); *E02F 9/2095* (2013.01); *H05K 7/20927* (2013.01); *B60K 2001/005* (2013.01); *Y02T 10/6226* (2013.01);
(Continued)

(58) Field of Classification Search
CPC combination set(s) only.
See application file for complete search history.

(56) References Cited

U.S. PATENT DOCUMENTS 7,496,441 B2 * 2/2009 Brandt ................. E02F 3/3414
                                                137/625.64
8,214,110 B2 * 7/2012 Morinaga ............... B60L 1/003
                                                172/4.5
(Continued)

FOREIGN PATENT DOCUMENTS

CN         102216198        10/2011
FR         2941102 A1        7/2010
(Continued)

OTHER PUBLICATIONS

International Search Report dated Sep. 24, 2013 from International Application No. PCT/JP2013/069947, 3 pages.
(Continued)

*Primary Examiner* — Thomas G Black
*Assistant Examiner* — Ana Thomas
(74) *Attorney, Agent, or Firm* — Fish & Richardson P.C.

(57) ABSTRACT

A hybrid hydraulic excavator includes an engine, a generator motor, a capacitor, a cooling system being configured to cool the capacitor, and a controller. The cooling system includes a circulation mechanism being configured to circulate a cooling water, and a cooler being configured to cool the cooling water with output from the engine. The controller prohibits auto-stop of the engine when it is determined that the capacitor is overheated.

8 Claims, 10 Drawing Sheets

(51) Int. Cl.
  *E02F 9/12*    (2006.01)
  *B60K 6/485*   (2007.10)
  *B60W 10/06*   (2006.01)
  *B60W 20/10*   (2016.01)
  *H05K 7/20*    (2006.01)
  *B60K 1/00*    (2006.01)

(52) U.S. Cl.
  CPC ........ *Y02T 10/6286* (2013.01); *Y10S 903/907* (2013.01)

(56) References Cited

U.S. PATENT DOCUMENTS

| | | | |
|---|---|---|---|
| 2010/0064677 A1* | 3/2010 | Kawaguchi | E02F 9/2075 60/431 |
| 2010/0299012 A1 | 11/2010 | Kozarekar | |
| 2011/0273141 A1* | 11/2011 | Kanbayashi | B60K 6/48 320/134 |
| 2012/0095644 A1 | 4/2012 | Dessirier et al. | |
| 2012/0130576 A1* | 5/2012 | Sugiyama | B60K 6/12 701/22 |
| 2013/0174539 A1* | 7/2013 | Ezawa | E02B 1/00 60/431 |
| 2014/0107881 A1* | 4/2014 | Sugiyama | B60K 6/12 701/22 |

FOREIGN PATENT DOCUMENTS

| | | |
|---|---|---|
| JP | 2000-234538 A | 8/2000 |
| JP | 2004-060526 A | 2/2004 |
| JP | 2008-78350 A | 4/2008 |
| JP | 2008-187047 A | 8/2008 |
| JP | 2008-255839 A | 10/2008 |
| JP | 2010-178446 A | 8/2010 |
| JP | 2011-51391 A | 3/2011 |
| JP | 2012-112102 | 6/2012 |
| JP | 2012-211432 | 11/2012 |
| JP | 2013-1372 A | 1/2013 |
| JP | 2013-064320 | 4/2013 |
| JP | 2013-142341 | 7/2013 |

OTHER PUBLICATIONS

Office Action in corresponding Chinese Application No. 201380004265.2, dated Jul. 12, 2016, 13 pages, with English translation.

Office Action in corresponding Japanese Application No. 2013-551458, dated Aug. 23, 2016, 7 pages, with English translation.

Office Action in corresponding Korean Application No. 10-2015-7026139, dated Oct. 11, 2016, 15 pages, with English translation.

* cited by examiner

61

62

HYBRID WORK MACHINE AND METHOD OF CONTROLLING AUTO-STOP OF ENGINE FOR THE SAME

CROSS-REFERENCE TO RELATED APPLICATIONS

This application claims priority to International Application No. PCT/2013/069947 filed on Jul. 23, 2013, the contents of which application are incorporated herein by reference in its entirety.

TECHNICAL FIELD

The present invention relates to a hybrid work machine equipped with a capacitor and a method of controlling auto-stop of an engine for the hybrid work machine.

BACKGROUND ART

As a work machine, there has been known a hybrid work machine such as an excavator in which an engine drives a generator motor and a hydraulic pump, whereby an electric motor for an upper rotary body, in which a cab and the like are provided, is driven by electric power generated by the generator motor while a hydraulic actuator for a working equipment and a hydraulic motor for a traveling device are driven by a pressure oil from the hydraulic pump. The electric power generated by the generator motor is charged in a capacitor serving as an electric storage device and is outputted from the capacitor to the electric motor through an inverter. In other words, while a hybrid automobile uses a secondary battery with a high energy density as an electric storage device, a hybrid work machine typically uses a capacitor, which is capable of quickly recovering energy and storing electricity, because an engine speed frequently varies in a short duration of time during an excavation work or the like.

Such a hybrid work machine sometimes uses an auto-idle-stop mechanism to stop the engine when the machine does not operate in order to further reduce fuel consumption. However, in some hybrid work machines, auto idle stop is prohibited when the voltage of an electric storage device falls below a predetermined level (Patent Literature 1).

Similarly, in some hybrid automobiles, auto idle stop is prohibited when a detected temperature of a battery (e.g., a lead-acid battery and a lithium-ion battery) used therein is high (Patent Literature 2). According to Patent Literature 2, when the temperature of the battery is high, a relatively low actual charging capacity is calculated. Therefore, when idle stop is carried out, it is unsure whether or not the battery can supply enough electric power to restart the engine. Accordingly, idle stop is prohibited when the battery temperature is high. Further, when idle stop is prohibited, the engine is continuously driven and the battery is also continuously charged, so that a charging mode is switched to a low-charging mode to suppress a rise in the battery temperature.

CITATION LIST

Patent Literature(s)

Patent Literature 1: JP-A-2008-255839
Patent Literature 2: JP-A-2004-60526

SUMMARY OF THE INVENTION

Problem(s) to be Solved by the Invention

Since an engine is stopped when auto idle stop is in operation, a cooling function becomes less effective and thus the operation temperatures of devices equipped in a vehicle are likely to rise beyond an appropriate operation-temperature range. In particular, when a capacitor used in a hybrid work machine is heated to a high temperature, the capacitance thereof is decreased and thus the charging/discharging performance is deteriorated. Further, the high temperature operation of the capacitor increases a decrement of the capacitance, which results in shortening the lifetime of the capacitor.

Patent Literature 1 only discloses that auto idle stop is not carried out when the voltage becomes low, but is silent about a cooling system for cooling a capacitor.

Likewise, Patent Literature 2 is also silent about a cooling system for a battery. In other words, Patent Literature 2 only discloses that while idle stop is prohibited in response to a high temperature of a battery to keep an engine driven, a charging current value and a charging voltage value for the battery are lowered to suppress a rise in the temperature of the battery, but is silent about a cooling system for a capacitor.

Therefore, Patent Literatures 1 and 2 fail to consider such a problem of a hybrid work machine with an auto-idle-stop mechanism that a cooling system for cooling a capacitor cannot rapidly adjust the temperature of the capacitor within an appropriate range due to a decrease in cooling performance.

An object of the invention is to provide a hybrid work machine with an arrangement capable of controlling the operation of an auto-idle-stop mechanism to prevent a decrease in the cooling performance of a cooling system for a capacitor, and a method of controlling auto-stop of an engine for the hybrid work machine.

Means for Solving the Problems

According to a first aspect of the invention, a hybrid work machine includes: an engine; a generator motor; a capacitor being configured to store electric power generated by the generator motor; a cooling system being configured to cool the capacitor, the cooling system including: a circulation mechanism being configured to circulate a refrigerant through the capacitor; and a cooler being configured to cool the refrigerant with output from the engine; and a controller being configured to determine whether or not the capacitor is overheated to control auto-stop of the engine, the controller prohibiting the auto-stop of the engine when it is determined that the capacitor is overheated.

According to the above arrangement, upon determination that the capacitor is overheated, the controller prohibits auto-stop of the engine. Incidentally, it may be determined whether or not the capacitor is overheated by directly measuring the temperature of the capacitor with a temperature sensor provided to the capacitor or by estimating the temperature of the capacitor based on the temperature of a capacitor case or the temperature of a cooling water. Alternatively, when it is possible to determine whether or not the capacitor is overheated depending on the properties of the capacitor, the properties of the capacitor (e.g., current value, voltage value and resistance) may be measured for the determination.

With the above arrangement, auto-stop of the engine is prohibited when the capacitor is overheated, thereby keeping the engine driven. Therefore, the cooling performance of the cooling system including the cooler that uses the output from the engine can be maintained to prevent a decrease in the cooling performance of the cooling system for cooling the capacitor. As a result, the capacitor is prevented from being used while being overheated, which results in prevention of a decrease in the capacitance and charging/discharging performance of the capacitor. Further, since the capacitor is prevented from continuously operating at a high temperature, a decrement of the capacitance is reduced to increase the lifetime of the capacitor.

In the first aspect of the invention, it is preferable that the hybrid work machine further include a capacitor-temperature sensor being configured to measure a temperature of the capacitor, in which when the temperature of the capacitor measured by the capacitor-temperature sensor is equal to or higher than a threshold for determining that the capacitor is overheated, the controller prohibits the auto-stop of the engine.

According to the above arrangement, the controller prohibits auto-stop of the engine when the temperature of the capacitor is measured by the capacitor-temperature sensor to find that the capacitor is overheated. Therefore, a decrease in the cooling performance of the cooling system can be prevented, so that the capacitor is prevented from being used while being overheated. As a result, a decrease in the capacitance and the charging/discharging performance of the capacitor can be prevented, thereby increasing the lifetime of the capacitor.

In the first aspect of the invention, it is preferable that the hybrid work machine further include: hybrid devices including at least the generator motor and the capacitor; and a temperature sensor being configured to measure temperatures of the hybrid devices, in which when the temperature of any one of the hybrid devices is equal to or higher than a threshold for determining that the one of the hybrid devices is overheated, the controller prohibits the auto-stop of the engine.

According to the above arrangement, the controller prohibits auto-stop of the engine when the temperatures of the hybrid devices including the generator motor and the capacitor are measured by the temperature sensor to find that any one of these devices is overheated. Therefore, when the cooling system using the output from the engine is used to cool the hybrid devices, a decrease in the cooling performance of the cooling system can be prevented, and thus the hybrid devices can be prevented from being used while being overheated. As a result, a decrease in the performance and lifetime of each hybrid device can be prevented.

In the first aspect of the invention, it is preferable that the hybrid work machine further include: a carrier; a rotary body being rotatable relative to the carrier by a rotary-driving generator motor; a power converter being configured to drive at least one of the generator motor and the rotary-driving generator motor with the electric power stored by the capacitor, the electric power being generated by at least one of the generator motor and the rotary-driving generator motor; and at least one of a generator-motor-temperature sensor being configured to measure a temperature of the generator motor, a power-converter-temperature sensor being configured to measure a temperature of the power converter, and a rotary-driving-generator-motor-temperature sensor being configured to measure a temperature of the rotary-driving generator motor, in which when the temperature of any one of the generator motor, the power converter and the rotary-driving generator motor measured by the temperature sensor is equal to or higher than a threshold for determining that the one of the generator motor, the power converter and the rotary-driving generator motor is overheated, the controller prohibits the auto-stop of the engine.

According to the above arrangement, the hybrid devices further include the power converter and the rotary-driving generator motor in addition to the generator motor and the capacitor. Therefore, it is possible to provide a hybrid hydraulic excavator including a carrier and a rotary body. Further, with the temperature sensor for detecting the temperatures of the hybrid devices, the temperatures of the hybrid devices can be detected. When any one of the above devices is overheated, auto-stop of the engine is prohibited. Therefore, when the cooling system using the output from the engine is used to cool the hybrid devices, a decrease in the cooling performance of the cooling system can be prevented, and thus the hybrid devices can be prevented from being used while being overheated. As a result, a decrease in the performance and lifetime of each hybrid device can be prevented.

In the hybrid work machine of the first aspect of the invention, it is preferable that: the capacitor include: a capacitor cell; a cooling base being configured to cool the capacitor cell; and a conductive wire being electrically connected to an electrode of the capacitor cell; a capacitor-temperature sensor be provided to measure a temperature of the capacitor, the capacitor-temperature sensor including a first temperature sensor being configured to measure a temperature of the cooling base and a second temperature sensor being configured to measure a temperature of the conductive wire; and the controller calculate the temperature of the capacitor based on the temperatures measured by the first temperature sensor and the second temperature sensor.

According to the above arrangement, the first temperature sensor is used to measure the temperature of the least heated portion in the capacitor while the second temperature sensor is used to measure the most heated portion in the capacitor. Therefore, the temperature of the center of the capacitor cell, which cannot be directly measured, can be calculated from the measurement values of these temperature sensors. As a result, it can be accurately determined whether or not the capacitor is overheated.

In the hybrid work machine of the first aspect of the invention, it is preferable that the controller determine that an auto-stop condition for the engine is satisfied when the temperature of the device measured by the temperature sensor is lower than the threshold for determining that the device is overheated and when a preset auto-stop-prohibition condition for the engine other than the temperature of the device is unsatisfied, and perform a control for stopping the engine when the auto-stop condition for the engine is kept satisfied until an elapse of a predetermined duration of time from the determination that the auto-stop condition for the engine is satisfied.

According to the above aspect, when the hybrid devices are not overheated with temperatures less than the thresholds and any auto-stop-prohibition condition other than the temperatures of the hybrid devices is not satisfied, it is determined that the auto-stop condition for the engine is satisfied and auto-stop is carried out. Incidentally, the auto-stop is not carried out immediately after the determination, but the engine is controlled to stop at the elapse of a predetermined duration of time. Therefore, when an operator performs an operation for restarting a work before the elapse of the predetermined duration of time, the auto-stop condition becomes unsatisfied and auto-stop of the engine is not carried out, so that the operator can immediately restart the work.

According to a second aspect of the invention, a method of controlling an engine-auto-stop for a hybrid work machine, the hybrid work machine including: an engine; a generator motor; a capacitor being configured to store an electric power generated by the generator motor; and a cooling system being configured to cool the capacitor, the cooling system including: a circulation mechanism being configured to circulate a refrigerant through the capacitor; and a cooler being configured to cool the refrigerant with output from the engine, the method includes prohibiting auto-stop of the engine when it is determined that the capacitor is overheated.

In the above aspect, auto-stop of the engine is also prohibited upon determination that the capacitor is overheated. Therefore, the engine can be kept driven, thereby maintaining the cooling performance of the cooling system including the cooler that uses the output from the engine. In this manner, it is possible to prevent deterioration of the cooling performance of the cooling system for cooling the capacitor. As a result, the capacitor is prevented from being used while being overheated, which results in prevention of a decrease in the capacitance and charging/discharging performance of the capacitor. Further, since the capacitor is prevented from continuously operating at a high temperature, a decrement of the capacitance is reduced to increase the lifetime of the capacitor.

In the second aspect of the invention, it is preferable that the method of controlling the engine-auto-stop for the hybrid work machine, in which the hybrid work machine further include a capacitor-temperature sensor being configured to measure a temperature of the capacitor, the method further include: determining that an auto-stop condition for the engine is satisfied when the temperature measured by the capacitor-temperature sensor is lower than a threshold for determining that the capacitor is overheated and when a preset auto-stop-prohibition condition for the engine other than the temperature of the capacitor is unsatisfied; and performing a control for stopping the engine when the auto-stop condition for the engine is kept satisfied until an elapse of a predetermined duration of time from the determination that the auto-stop condition for the engine is satisfied.

According to the above arrangement, when the capacitor is not overheated with a temperature less than the threshold and any auto-stop-prohibition condition other than the temperature of the capacitor is not satisfied, it is determined that the auto-stop condition for the engine is satisfied and auto-stop is carried out. Incidentally, the auto-stop is not carried out immediately after the determination, but the engine is controlled to stop at the elapse of a predetermined duration of time. Therefore, when an operator performs an operation for restarting a work before the elapse of the predetermined duration of time, the auto-stop condition becomes unsatisfied and auto-stop of the engine is not carried out, so that the operator can immediately restart the work.

DESCRIPTION OF EMBODIMENT(S)

Figure 1:
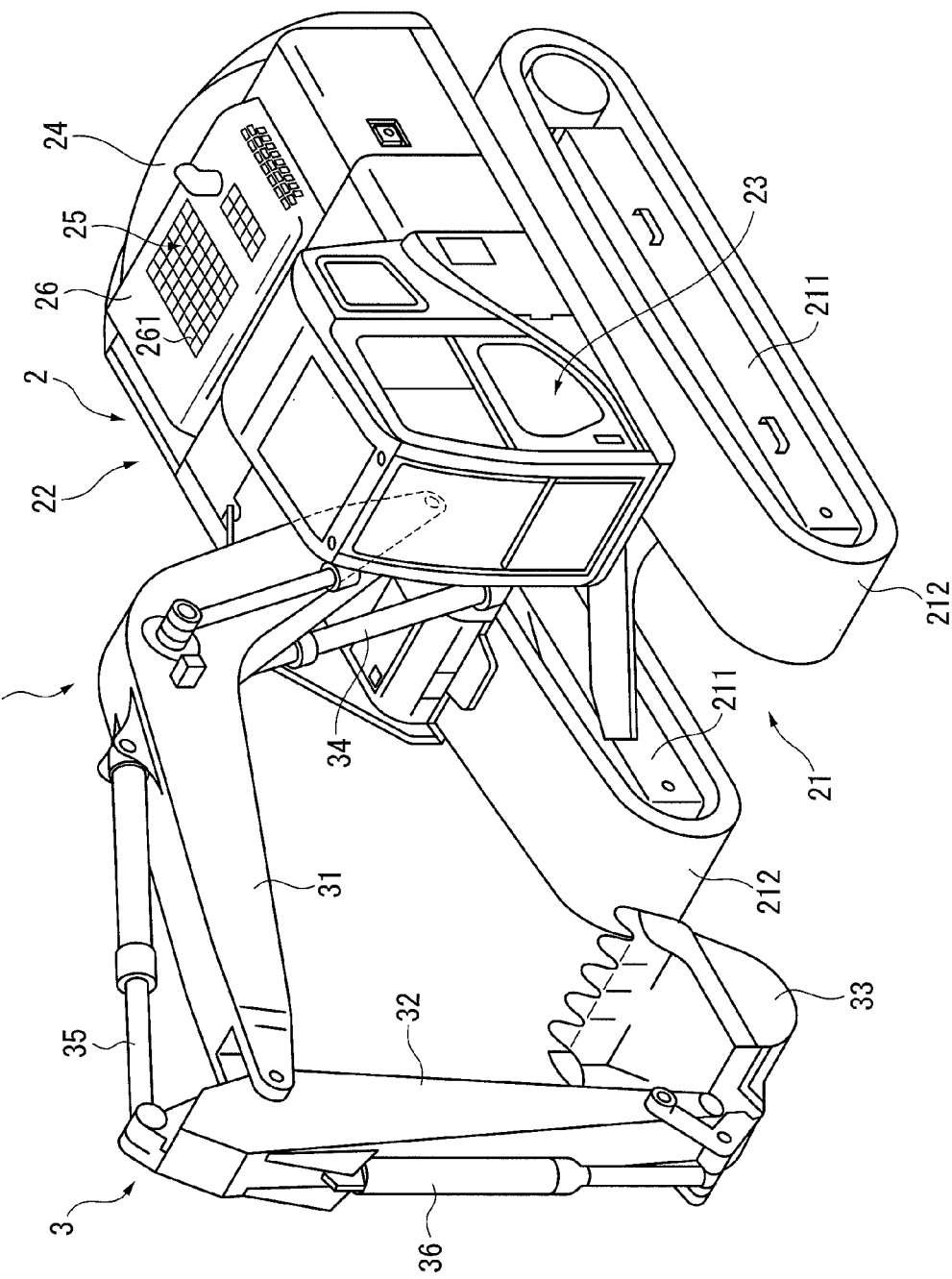
FIG. 1 is a perspective view of a hybrid hydraulic excavator according to an exemplary embodiment of the invention.

Exemplary embodiment(s) of the invention will be described below with reference to the attached drawings.
Description on Hydraulic Excavator as a Whole FIG. 1 shows a hybrid hydraulic excavator 1 as a hybrid work machine according to the exemplary embodiment. The hybrid hydraulic excavator 1 includes a vehicle body 2 and working equipment 3.
Vehicle Body The vehicle body 2 includes a carrier 21 and a rotary body 22 rotatably provided on the carrier 21. The carrier 21 includes a pair of traveling devices 211. The respective traveling devices 211 are provided with crawler belts 212. Later-described hydraulic motors 213R, 213L drive the crawler belts 212, whereby the hybrid hydraulic excavator 1 travels.
Rotary Body The rotary body 22 includes a cab 23, a counterweight 24 and an engine compartment 25. The counterweight 24 is provided for weight balance with the working equipment 3 and is filled with weights. An engine hood 26 covering the engine compartment 25 has a grid-like opening 261. A cooling air from the outside is taken into the engine compartment 25 through the opening 261.
Working Equipment The working equipment 3 is attached to a front center of the rotary body 22 and includes a boom 31, an arm 32, a bucket 33, a boom cylinder 34, an arm cylinder 35 and a bucket cylinder 36. The boom 31, the arm 32, the bucket 33 and the rotary body 22 are actuated in response to a tilting operation on right and left working equipment levers provided on the right and left of an operator seat, respectively. A base end of the boom 31 is rotatably connected to the rotary body 22. A distal end of the boom 31 is rotatably connected to a base end of the arm 32. A distal end of the arm 32 is rotatably connected to the bucket 33.

The boom cylinder 34, the arm cylinder 35 and the bucket cylinder 36 are hydraulic cylinders driven by hydraulic oil discharged from hydraulic pumps 6. The boom cylinder 34 actuates the boom 31. The arm cylinder 35 actuates the arm 32. The bucket cylinder 36 actuates the bucket 33.
Arrangement of Driving System for Hybrid Hydraulic Excavator FIG. 2 shows an overall structure of a driving system for the hybrid hydraulic excavator 1.

Figure 2:
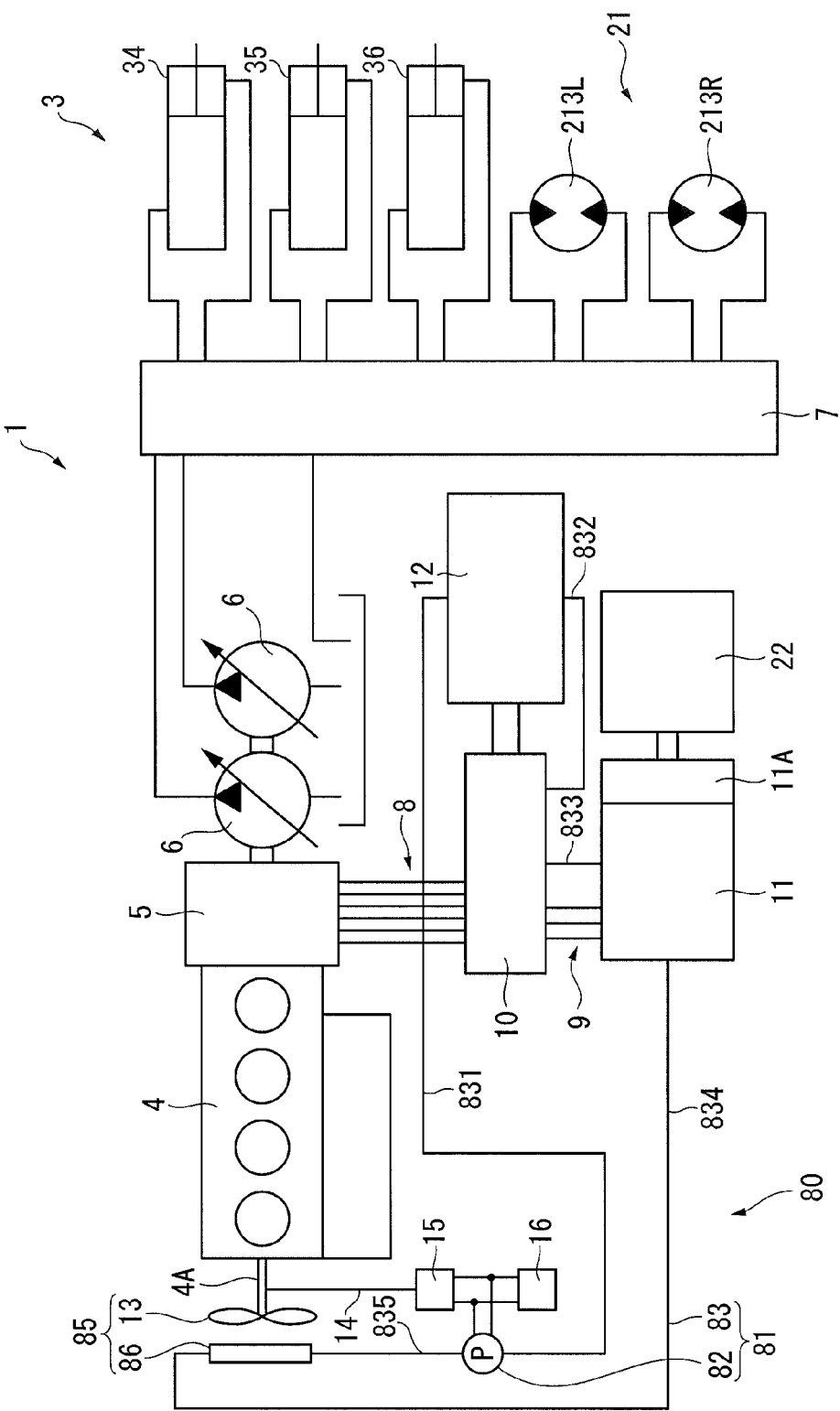
FIG. 2 shows an overall structure of a driving system for the hybrid hydraulic excavator.

As shown in FIG. 2, the hybrid hydraulic excavator 1 includes an engine 4 as a driving source. A generator motor 5 and a pair of hydraulic pumps 6, 6 are connected in series to an output shaft of the engine 4 and are driven by the engine 4. The engine 4 and the generator motor 5 may be interconnected via PTO.

The engine 4 has another output shaft 4A attached with a fan 13. The output shaft 4A of the engine 4 is further connected to an alternator 15 via a belt 14. Electric power generated by the alternator 15 is stored in a battery 16. The battery 16 drives a starter (not shown) of the engine 4. With this arrangement, when a key switch (not shown) is turned on, the battery 16 drives the starter to start up the engine 4.

The hydraulic oil fed by pressure from the hydraulic pumps 6 is supplied to the working equipment 3 through a control valve 7, whereby the working equipment 3 is hydraulically actuated. The carrier 21 includes the hydraulic motors 213R, 213L for driving sprockets engaged with the right and left crawlers 212. The hydraulic oil from the hydraulic pumps 6 is supplied to the hydraulic motors 213R, 213L through the control valve 7 in response to an operation on a travel lever (not shown) provided in the cab 23.

Arrangement of Hybrid Device

The generator motor 5, which functions as a power generator and as a motor, is provided by, for instance, an SR (Switched Reluctance) motor. A power cable 8 is connected to the generator motor 5. Electric power generated by the generator motor 5 is transmitted to a power converter 10 through the power cable 8.

One end of another power cable 9 is connected to the power converter 10 while the other end of the power cable 9 is connected to a rotary-driving generator motor 11 for driving the rotary body 22. The rotary-driving generator motor 11 is provided by, for instance, a PM (Permanent Magnet) motor.

Moreover, a capacitor 12 is connected to the power converter 10 and the electric power generated by the generator motor 5 is stored in the capacitor 12 through the power converter 10. The electric power stored in the capacitor 12 is supplied to the rotary-driving generator motor 11 from the capacitor 12 through the power converter 10 during a rotary operation.

The rotary-driving generator motor 11 drives the rotary body 22, which is rotatably provided on a top of the carrier 21, through a reducer 11A having a planet gear mechanism and the like. A regenerative braking energy generated when the speed of the rotary-driving generator motor 11 is reduced is also stored in the capacitor 12 through the power converter 10.

The electric power from the capacitor 12 is also supplied to the generator motor 5 as needed in order to, for instance, supplement the output from the engine 4 at the starting-up of the engine 4. In this manner, the generator motor 5 is used as a motor to assist the engine 4.

As described above, compared with a typical hydraulic excavator, the hybrid hydraulic excavator 1 is additionally equipped with hybrid devices such as the generator motor 5, the power converter 10, the rotary-driving generator motor 11 and the capacitor 12.

Incidentally, although only the rotary-driving generator motor 11 is provided as a rotary motor for driving the rotary body 22 in the exemplary embodiment, a hydraulic motor for rotary movement may be further provided in addition to the rotary-driving generator motor 11.

The hybrid devices may include at least the generator motor 5, the power converter 10 and the capacitor 12. In other words, as an actuator to be driven with the electric power stored in the capacitor 12, any actuator may be usable depending on the type and the like of a hybrid work machine in place of the rotary-driving generator motor 11.

Cooling System for Hybrid Devices

As shown in FIG. 2, the hybrid hydraulic excavator 1 further includes a cooling system 80 that cools the hybrid devices.

The cooling system 80 includes: a circulation mechanism 81 that circulates a cooling water serving as a refrigerant; and a cooler 85 that cools the cooling water. The circulation mechanism 81 includes: a cooling pump 82 driven by the battery 16; and a channel 83 connected to an inlet and an outlet of the cooling pump 82.

The cooler 85 includes: a radiator 86 connected to the cooling pump 82 through the channel 83; and the fan 13 opposed to the radiator 86.

The channel 83 includes: a channel 831 located between the cooling pump 82 and the capacitor 12; a channel 832 located between the capacitor 12 and the power converter 10; a channel 833 located between the power converter 10 and the rotary-driving generator motor 11; a channel 834 located between the rotary-driving generator motor 11 and the radiator 86; and a channel 835 located between the radiator 86 and the cooling pump 82.

In the cooling system 80 as described above, when the fan 13 is rotated, fresh air (a cooling air) is sucked through the radiator 86 and the cooling water flowing through the radiator 86 is cooled by heat-exchange between the fresh air and the cooling water. After being cooled in the radiator 86, the cooling water is circulated through the channel 83 by the cooling pump 82 to flow through respective cooling channels provided in the capacitor 12, the power converter 10 and the rotary-driving generator motor 11 in sequence, thereby cooling these hybrid devices. After cooling the hybrid devices, the cooling water with an increased temperature is again cooled in the radiator 86.

When the engine 4 is stopped, the fan 13, which is rotated with the output shaft 4A of the engine 4, also stops rotating. In such a case, since no fresh air is sucked into the radiator 86 by the fan 13, heat-exchange is not performed in the radiator 86 and thus the cooling water is not efficiently cooled. Therefore, the temperature of the cooling water is increased to cause deterioration of the cooling performance, so that the hybrid devices may be insufficiently cooled. Although the fan 13 is directly driven with power from the engine 4 in the exemplary embodiment, the fan 13 may be driven with power from the hydraulic pumps 6.

Arrangement of Control System

Next, description will be made on a control system 40 that controls the hybrid hydraulic excavator 1 with reference to FIG. 3.

Figure 3:
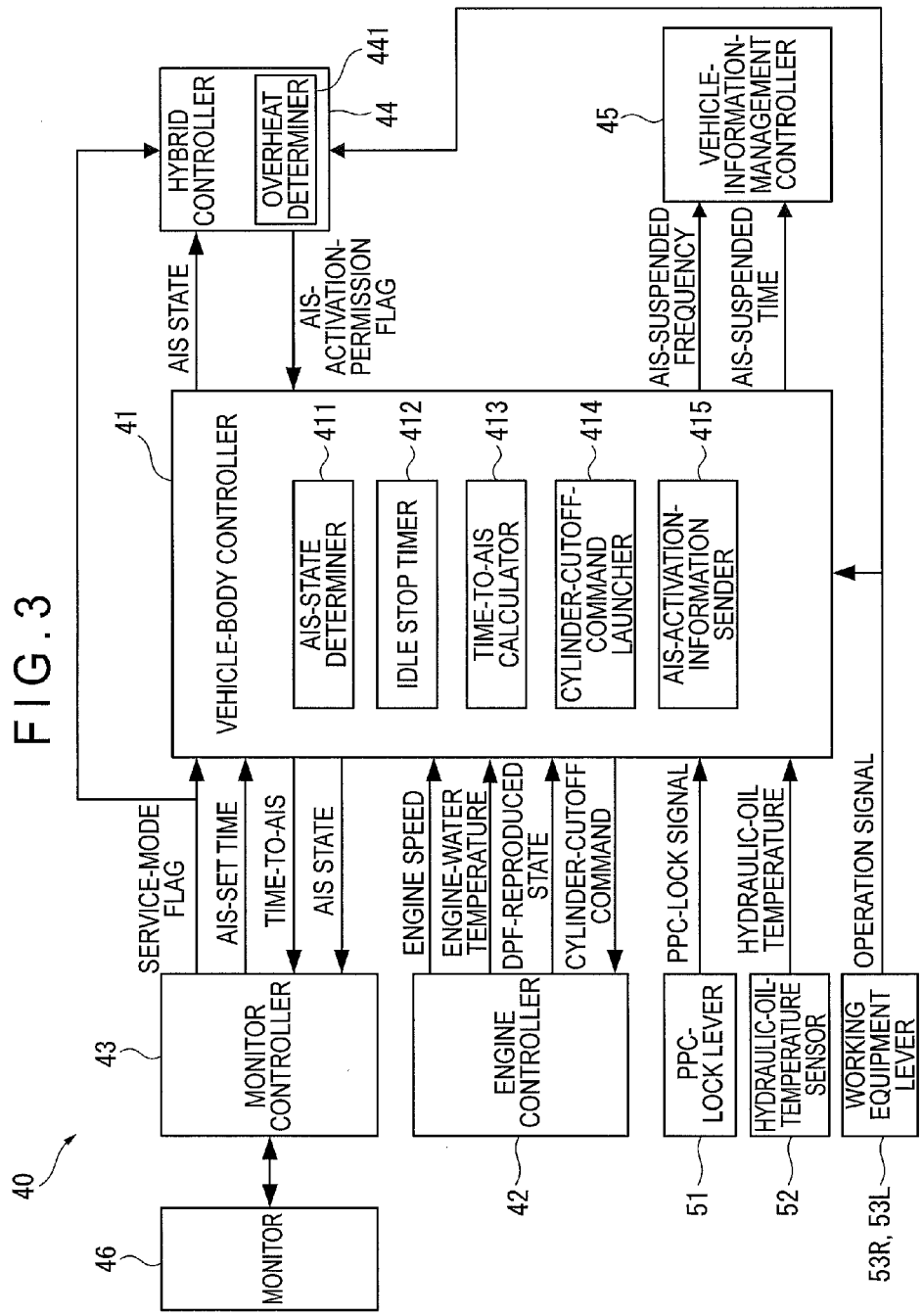
FIG. 3 is a block diagram showing a control system for the hybrid hydraulic excavator.

As shown in FIG. 3, the control system 40 mainly includes a vehicle-body controller 41, an engine controller 42, a monitor controller 43, a hybrid controller 44, and a vehicle-information-management controller 45. The controllers 41 to 45 are connected through a controller area network (CAN) for mutual data-communication.

Vehicle-Body Controller

The vehicle-body controller 41 (also referred to as a pump controller) is a controller that controls a drive section in the vehicle body (e.g., the inclination angle of a swash plate in each of the hydraulic pumps 6 driven by the engine 4), and is capable of data-communication with the other controllers 42 to 45 via the controller area network.

The vehicle-body controller 41 includes an AIS (Auto Idle Stop)-state determiner 411, an idle stop timer 412, a time-to-AIS calculator 413, a cylinder-cutoff-command launcher 414 and an AIS-activation-information sender 415. The respective specific functions of these elements 411 to 415 will be described later.

The vehicle-body controller 41 is inputted with a PPC-lock signal from a PPC (Pressure Proportional Control)-lock lever 51 provided in the cab 23 and with hydraulic-oil-temperature data from a hydraulic-oil-temperature sensor 52 that detects the temperature of the hydraulic oil.

When an operator tilts the working equipment levers 53R, 53L provided on the right and left of the operator seat, a PPC valve provided to each of the working equipment levers 53R, 53L generates a pilot pressure in accordance with the tilting and sends an operation signal corresponding to the pilot pressure to the vehicle-body controller 41 and the hybrid controller 44. In accordance with the forward/backward and rightward/leftward movement of the working equipment lever 53R, the vehicle-body controller 41 sends a command for vertically actuating the boom 31 and/or a command for actuating the bucket 33 for digging/dumping. In accordance with the forward/backward and rightward/leftward movement of the working equipment lever 53L, the vehicle-body controller 41 sends a command for actuating the arm 32 for digging/dumping and the hybrid controller 44 sends a command for the right/left turning of the rotary-driving generator motor 11.

Engine Controller

The engine controller 42 is a controller that controls the engine 4 based on, for instance, data obtained by an accelerator-pedal-angle sensor and an engine-speed sensor. The engine controller 42 sends engine-working conditions such as an engine speed, an engine-water temperature and the regenerated state of a diesel particulate filter to the vehicle-body controller 41.

Further, in response to a later-described cylinder-cutoff command from the cylinder-cutoff-command launcher 414 of the vehicle-body controller 41, the engine controller 42 stops the engine 4 to stop idling. In other words, the cylinder-cutoff-command launcher 414 of the vehicle-body controller 41 serves as an auto-stop controller that controls auto-stop of the engine 4.

Monitor Controller

The monitor controller 43 controls the operation of the monitor 46 for an operator. The monitor 46 is provided in the cab 23. The monitor 46 may switchably display: a normal image showing vehicle conditions such as an engine-water temperature and a fuel amount; a service image for charge release; and predetermined images related to operations such as setting of AIS, vehicle-body conditions, and the like. Further, the monitor 46 is provided with a switch for inputting setting of screen modes such as the service image and the standard image. The monitor controller 43 and the monitor 46 may be enclosed in the same housing.

The monitor controller 43 sends a service-mode flag and an AIS-set time to the vehicle-body controller 41. The service-mode flag is set at "1: service mode on" when a repairer chooses a service mode by operating the switch in order to maintain the vehicle body The AIS-set time is a preset time that will elapse since AIS-activation conditions (auto-stop conditions for the engine 4) are satisfied until a later-described AIS state becomes "commanding". With the switch provided to the monitor 46, an operator can set the AIS-set time in a range, for instance, from 1 minute (60 seconds) to 10 minutes (600 seconds).

AIS-State Determiner and Time-to-AIS Calculator

The AIS-state determiner 411 and the time-to-AIS calculator 413 of the vehicle-body controller 41 send an AIS state and a time-to-AIS to the monitor controller 43, respectively. The time-to-AIS is a time remaining before the AIS state becomes "commanding" after the AIS-activation conditions are satisfied. Accordingly, when the AIS-activation conditions are satisfied, the time-to-AIS calculator 413 activates the idle stop timer 412 to start counting and obtains the time-to-AIS by subtracting a count value from the AIS-set time. Incidentally, when the time-to-AIS becomes zero or less as a result of the subtraction, the time-to-AIS calculator 413 sets the time-to-AIS at "0".

Hybrid Controller

The hybrid controller 44 controls driving of a driver 101, an inverter 104 and a booster 105 that enable transmission/reception of electric power among the generator motor 5, the rotary-driving generator motor 11 and the capacitor 12 as describe later. In other words, the hybrid controller 44 controls driving of the power converter 10.

The AIS-state determiner 411 of the vehicle-body controller 41 informs the hybrid controller 44 of the AIS state.

The hybrid controller 44 includes an overheat determiner 441 that determines whether or not the hybrid devices such as the capacitor 12 are overheated. The hybrid controller 44 informs the vehicle-body controller 41 of an AIS-activation-permission flag based on the determination result from the overheat determiner 441 as described later.

Vehicle-Information-Management Controller

The vehicle-information-management controller 45 is a device for regularly or irregularly collecting various conditions of the hybrid hydraulic excavator 1 and sending them to an administrative center. The vehicle-information-management controller 45 is connected to the administrative center for intercommunication via a radio communication network such as communication satellite and mobile communication network. The vehicle-information-management controller 45 can also find a current position by receiving a radio wave from a GPS satellite and send current position information to the administrative center.

The AIS-activation-information sender 415 of the vehicle-body controller 41 sends an AIS-suspended frequency and an AIS-suspended time to the vehicle-information-management controller 45. For instance, the AIS-suspended frequency and the AIS-suspended time in a day are sent to the vehicle-information-management controller 45 through regular communication once a day. The vehicle-information-management controller 45 sends the obtained information to the administrative center.

Arrangement of Power Converter

Figure 4:
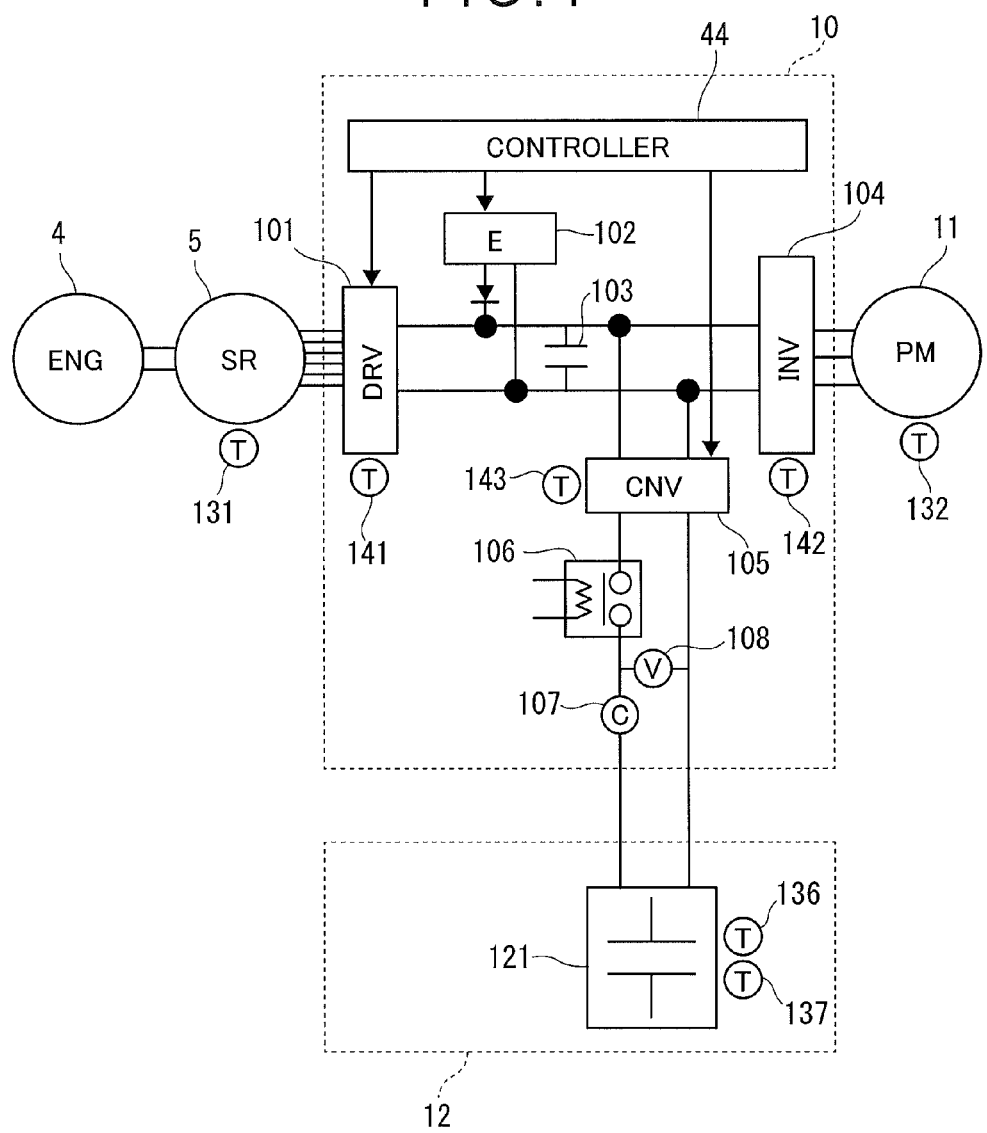
FIG. 4 shows a circuitry of hybrid devices in the hybrid hydraulic excavator.

FIG. 4 shows an internal structure of the power converter 10 and the capacitor 12.

The power converter 10 includes: the driver 101 that converts direct current from the rotary-driving generator motor 11 or the capacitor 12 via the inverter 104 into alternating current and supplies the alternating current to the generator motor 5 to drive the generator motor 5; an excitation power supply 102 that supplies electric current for exciting a coil to start generation of electric power by the generator motor 5; a capacitor 103 for waveform shaping; the inverter 104 that converts direct current from the generator motor 5 or the capacitor 12 into alternating current and supplies the alternating current to the rotary-driving generator motor 11 to drive the rotary-driving generator motor 11; the booster 105 that transforms direct current from each of the inverter 104 and the driver 101 to boost an inter-terminal voltage of the capacitor 12; a contactor 106 provided between the capacitor 12 and the booster 105; an ammeter 107 that detects the electric current of the capacitor 12; a voltmeter 108 that detects the voltage of the capacitor 12; and the hybrid controller 44 that controls the driver 101, the excitation power supply 102 and the booster 105.

The capacitor 12 (i.e., an electric storage device) includes a plurality of capacitor cells 121 and charges/discharges electric power by receiving/transmitting direct current from/to the booster 105. The plurality of capacitor cells 121 are electrically connected to one another in series or in parallel.

Temperature Sensors for Hybrid Devices

As shown in FIG. 4, temperature sensors are provided to measure the temperatures of the hybrid devices. Specifically, the temperature sensors include: a generator-motor-temperature sensor 131 that measures the temperature of the generator motor 5; a rotary-driving-generator-motor-temperature sensor 132 that measures the temperature of the rotary-driving generator motor 11; a power-converter-temperature sensor that measures the temperature of the power converter 10; and capacitor-temperature sensors 136, 137 that measure the temperature of the capacitor 12.

The power-converter-temperature sensor includes: a temperature sensor 141 for the driver 101; a temperature sensor 142 for the inverter 104; and a temperature sensor 143 for the booster 105.

Temperature data obtained from each of these temperature sensors 131, 132, 136, 137, 141, 142 and 143 is sent to the hybrid controller 44.

Arrangement of Capacitor

Figure 5:
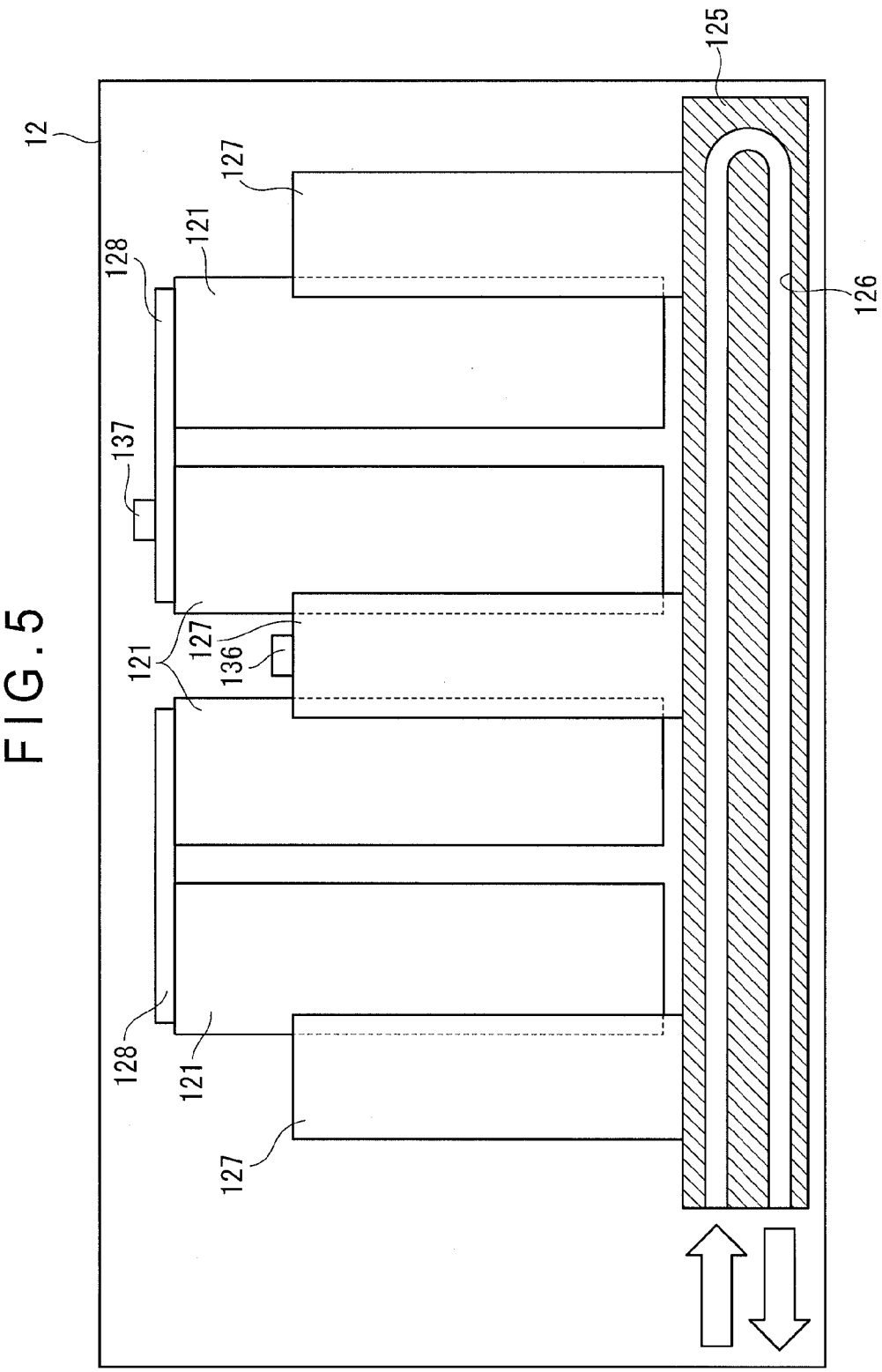
FIG. 5 shows an arrangement of a capacitor.

As shown in FIG. 5, the capacitor 12 includes: the plurality of capacitor cells 121; a water-cooling base 125 that is made of metal such as aluminum and has a channel 126 for the cooling water formed therein; a heat sink 127 that is made of metal such as aluminum and is in contact with the water-cooling base 125; and a conductive wire 128 (also referred to as bus bar).

The capacitor cells 121 are held in a resin-molded case (not shown). The conductive wire 128 is inserted in the resin-molded case. The conductive wire 128 then enables electrical connection between the negative electrode of one of adjacent two of the capacitor cells 121 and the positive electrode of the other of the adjacent two of the capacitor cells 121.

Cooling Structure for Capacitor

The channel 126 of the water-cooling base 125 is connected to the channel 831 through which the cooling water flows into the capacitor 12 and the channel 832 through which the cooling water flows out of the capacitor 12, the channels 831, 832 being connected to the external cooling pump 82 for circulating the cooling water. With the above arrangement, the cooling water circulated by the cooling pump 82 flows through the channel 126 to cool the water-cooling base 125. Since the heat sink 127 is in contact with the water-cooling base 125, the heat sink 127 is cooled to a temperature substantially equal to that of the water-cooling base 125.

The heat sink 127 is in contact with sides of the capacitor cells 121. Therefore, heat generated when the capacitor cells 121 charge/discharge electric power is transferred to the heat sink 127 and collected by the cooling water via the water-cooling base 125. In this manner, the capacitor 12 is kept at a predetermined temperature.

Incidentally, the cooling pump 82 is driven by the battery 16, which belongs to an electrical wiring system different from one related to the hybrid devices. Since the battery 16 included in such an electrical wiring system is also electrically charged by the alternator 15 when the engine 4 is driven, the cooling pump 82 is controlled not to be driven when the engine 4 is stopped.

Measurement of Temperature of Capacitor

The temperature sensors 136, 137, which are thermistors, are provided to the capacitor 12. The temperature sensor 136 (a first temperature sensor) is provided to the heat sink 127 to measure a capacitor-base temperature at the water-cooling base 125. The temperature sensor 137 (a second temperature sensor) is provided to the conductive wire 128 to measure a capacitor-bus-bar temperature at the conductive wire (bus bar) 128.

In a temperature distribution of the capacitor cells 121, the capacitor-base temperature is the lowest while the capacitor-bus-bar temperature is the highest. A center temperature of the capacitor cells 121 is represented by an intermediate value between the temperatures measured by the temperature sensors 136, 137. Thus, the center temperature of the capacitor cells 121, which is difficult to be directly measured with a temperature sensor, can be estimated. Specifically, the center temperature of the capacitor cells 121 can be calculated by adding the capacitor-base temperature with a temperature rise resulting from charge/discharge of the capacitor 12. The temperature rise resulting from charge/discharge of the capacitor 12 can be calculated from a measurement value such as a capacitor current value and a parameter value such as an internal resistance.

Thus, the hybrid controller 44 can calculate the center temperature of the capacitor cells 121 from the measurement values obtained by the temperature sensors 136, 137, and determine whether or not the calculated center temperature exceeds a threshold (e.g., 60 degrees C.) (i.e., whether or not the capacitor 12 is overheated).

Alternatively, the temperature of the capacitor 12 may be estimated by measuring the temperature of the case for the capacitor cells 121 or estimated from the temperature of the cooling water or the like.

Temperature Characteristics of Capacitor

The capacitor cells 121 are each provided by, for instance, an electrical double-layer capacitor. The capacitor cells 121 have a small temperature dependence as compared with a secondary battery, and thus are usable over a relatively wide temperature range.

However, the capacitor cells 121 also generally experience a decrease in capacitance and internal resistance when they are heated to, for instance, 60 degrees C. or higher. The decrease in capacitance leads to deterioration of the charging/discharging performance of the capacitor 12.

Additionally, the high temperature operation of the capacitor 12 decreases the device lifetime thereof. According to Arrhenius law (i.e., a law of being doubled for an increase by 10 degrees C.), the lifetime of a typical capacitor is halved when the temperature of the capacitor is increased by 10 degrees C. during operation. Likewise, an increase in the operation temperature of the capacitor 12 results in a further decrease in capacitance and thus in a significant decrease in device lifetime.

In view of the above, a cooling control on the capacitor 12 is desired so as to prevent the operation temperature of the capacitor 12 from being increased to 60 degrees C. or higher (i.e., to prevent the capacitor 12 from being overheated). Further, since the cooling control on the capacitor 12 is inactive when the engine 4 is stopped as described above, the AIS operation should be controlled to be prohibited when the capacitor 12 is heated to a high temperature as described later.

Control on AIS Operation

Figure 6:
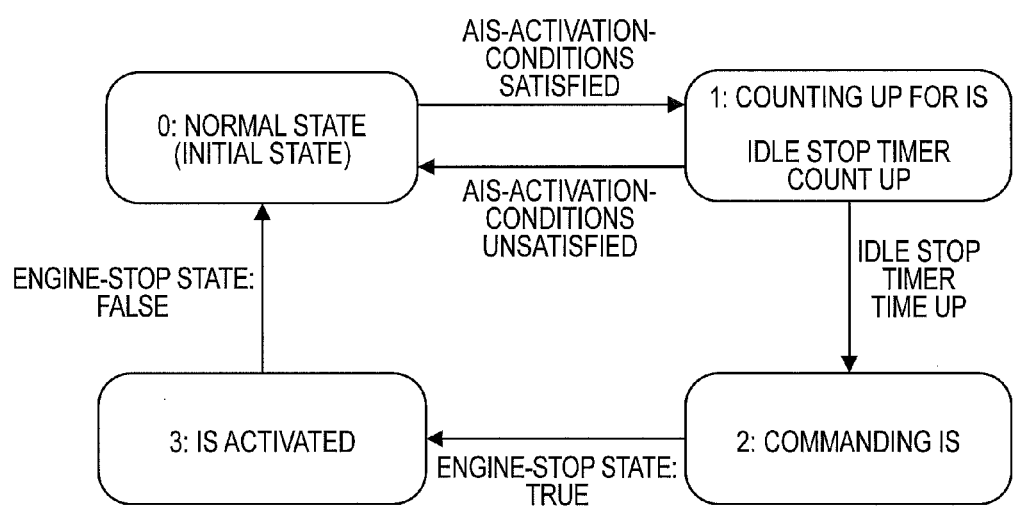
FIG. 6 is a transition diagram showing an AIS state.

Next, description will be made on a control on an AIS (Auto Idle Stop) operation for the hybrid hydraulic excavator 1. First, a change in the operation state of AIS (i.e., AIS state) will be explained with reference to FIG. 6.

Change in Operation State of AIS

The vehicle-body controller 41 informs the monitor controller 43 and the hybrid controller 44 of the AIS state, for which there are four options: "0: normal state", "1: counting up for IS", "2: commanding IS" and "3: IS activated". Specifically, the AIS-state determiner 411 sets a variable AISState representing an auto-idle-stop state at one of 0 to 3.

AIS State=0: Normal State (Initial State)

When the AIS state is "normal state", the engine 4 is in a normal operation and later-described AIS-activation conditions are not satisfied.

AIS State=1: Counting Up for IS

When the AIS state is "counting up for IS (Idle Stop)", the AIS-activation conditions are satisfied and the idle stop timer 412 is counting up. At this time, the engine 4 is still in the normal operation.

AIS State=2: Commanding IS

When the AIS state is "commanding IS", the count value of the idle stop timer reaches the above AIS-set time (i.e., the counting is ended), and then a cylinder-cutoff command is sent from the cylinder-cutoff-command launcher 414 to the engine controller 42 in order to command engine stop.

AIS State=3: IS Activated

When the AIS state is "IS activated", the engine 4 is stopped in response to the cylinder-cutoff command. Afterwards, when a key is again turned on to restart the engine, the AIS state returns to the normal state.

AIS-Activation Conditions

Next, description will be made on the AIS-activation conditions for changing the AIS state from the normal state to being counting up for IS. Incidentally, specific details of the AIS-activation conditions are determined depending on the type of a hybrid work machine to be controlled. Accordingly, the following conditions are merely examples of the AIS-activation conditions for the hybrid hydraulic excavator 1, and thus partial deletion and/or addition are possible depending on the arrangement of the hybrid hydraulic excavator 1 or the like. According to the exemplary embodiment, the following conditions (1) to (14) are provided.

Specific Details on AIS-Activation Conditions (1) An engine state is an "operating" state.

When the engine 4 is stopped, it is not necessary to activate AIS.

(2) A diesel particulate filter is not being regenerated.

In order to regenerate the diesel particulate filter, soot needs to be burnt, and thus the engine 4 needs to be driven.

(3) An operation mode is neither "lifting mode (L Mode)" nor "arm-crane mode".

When the engine 4 is stopped with the operation mode accompanying a hanging operation, accidents such as an unintentional stop of the working equipment 3 during the hanging operation may be caused.

(4) The service-mode flag sent from the monitor controller 43 is not "1: service-mode on".

Since a maintenance worker works with reference to various information displayed on the monitor 46 or the like when the service mode is on, maintenance cannot be performed when the engine 4 is stopped.

(5) No reset signal for the AIS-set time is inputted from the monitor controller 43.

Specifically, as described above, when the AIS-activation conditions are satisfied and the AIS state turns to "1: counting up for IS", the idle stop timer 412 starts counting up and the time-to-AIS is counted down on the monitor 46. When an operator sees the time-to-AIS on the monitor 46, he/she may change the time-to-AIS by inputting another time-to-AIS from the monitor 46. For instance, assuming that the time-to-AIS is set at 1 minute (60 seconds) and countdown from 60 seconds by seconds is displayed, the operator may reset the AIS-set time at 5 minutes (300 seconds). In this case, if AIS were activated in accordance with the previous time-to-AIS (i.e., 60 seconds in the above case), the activation of AIS would be against the intent of the operator who reset the time-to-AIS. Accordingly, in response to the reset signal inputted from the monitor controller 43, the vehicle-body controller 41 temporarily determines that the AIS-activation conditions are unsatisfied and the AIS state returns to "0: normal state". The vehicle-body controller 41 then again determines whether or not the AIS-activation conditions are satisfied.

(6) A quick-coupler (multi-coupler), which may be optionally provided in order to easily replace and attach various attachments such as a bucket, a breaker and a crusher, is not in operation.

When the engine 4 is stopped during replacement of the attachments, the replacement cannot be continued.

(7) The AIS-activation-permission flag sent from the hybrid controller 44 is "1: AIS-activation permitted".

When the AIS-activation-permission flag (described later) is "0: AIS-activation disapproved", one of the hybrid devices may be overheated or one of the temperature sensors may malfunction, and thus the engine 4 needs to be driven to continue the cooling operation.

(8) An engine-water-temperature sensor is in a normal operation.

When the engine-water-temperature sensor malfunctions due to disconnection, short-circuit or the like, the engine-water temperature cannot be accurately measured and thus it cannot be determined whether or not the engine 4 is overheated. Accordingly, the engine 4 needs to be continuously cooled, so that the engine 4 cannot be stopped.

(9) The engine-water temperature does not reach an overheated level.

When the engine water is overheated, the engine 4 needs to be continuously cooled, so that the engine 4 cannot be stopped. Incidentally, when determined that the engine-water temperature sent from the engine controller 42 exceeds a predetermined threshold to reach the overheated level, the vehicle-body controller 41 commands the monitor controller 43 to display an overheating caution. Therefore, with the overheating caution displayed on the monitor 46, an operator can understand that AIS is not activated due to overheat of the engine-water temperature.

(10) An automatic engine warm-up is not in OPERATION.

When the engine 4 is started under a low ambient temperature in a cold region or the like, the automatic engine warm-up is performed. In this case, when the engine 4 is stopped, the warm-up of the engine 4 is disadvantageously required again at the time of restart of the engine 4.

(11) The hydraulic-oil-temperature sensor 52 is in a normal operation.

When the hydraulic-oil-temperature sensor 52 malfunctions due to disconnection, short-circuit or the like, the temperature of the hydraulic oil cannot be accurately measured. Accordingly, the hydraulic oil needs to be continuously cooled, so that the engine 4 cannot be stopped.

(12) The hydraulic-oil temperature does not reach an overheated level. When the hydraulic oil is overheated, the engine 4 needs to be continuously cooled, so that the engine 4 cannot be stopped. Incidentally, when determined that the hydraulic-oil temperature sent from the hydraulic-oil-temperature sensor 52 exceeds a predetermined threshold to reach the overheated level, the vehicle-body controller 41 commands the monitor controller 43 to display an overheating caution. Therefore, with the overheating caution displayed on the monitor 46, an operator can understand that AIS is not activated due to overheat of the hydraulic-oil temperature.

(13) The controller area network is in a normal operation.

When the controller area network is not in the normal operation due to, for instance, a communication error on the controller area network, various information cannot be sent to the vehicle-body controller 41 and the like, and thus it cannot be accurately determined whether or not the AIS-activation conditions are satisfied.

(14) The PPC-lock lever is in a "locked" state. When the PPC-lock lever 51 is not in the locked state, a work may be restarted by operating an operation lever, so that the engine 4 cannot be stopped.

Determination Process for AIS-Activation-Permission Flag

According to the exemplary embodiment, at least as long as the AIS-activation-permission flag (HYB) sent from the hybrid controller 44 is not "1: AIS-activation permitted", the AIS-activation conditions are not satisfied (see the AIS-determination condition (7)).

In connection with the above, a determination process for the AIS-activation-permission flag performed by the hybrid controller 44 will be described with reference to a flow chart shown in FIG. 7.

The hybrid controller 44 first determines whether or not the capacitor-temperature sensors 136, 137 are in a normal operation (i.e., whether or not the temperature sensors 136, 137 have errors such as short-circuit and disconnection) (step S11).

In the case of "Yes" in step S11, the hybrid controller 44 determines whether or not the other temperatures sensors 131, 132, 141, 142 and 143 for the hybrid devices are in a normal operation (step S12).

It is determined whether or not the temperature sensors are in the normal operation in steps S11 and S12 because the temperature sensors have to be in the normal operation to accurately measure temperatures.

In the case of "Yes" in step S12, the overheat determiner 441 of the hybrid controller 44 calculates the temperature of the capacitor 12 (the center temperature of the capacitor cells 121) based on the temperatures measured by the capacitor-temperature sensors 136, 137, and determines whether or not the calculated temperature of the capacitor 12 exceeds the predetermined threshold (e.g. 60 degrees C.) to reach an overheated level (step S13).

In the case "No" in step S13, based on the temperatures measured by the other temperature sensors 131, 132, 141, 142 and 143, the overheat determiner 441 of the hybrid controller 44 determines whether or not the temperature of each of the hybrid devices other than the capacitor 12 (i.e., the generator motor 5, the rotary-driving generator motor 11, the driver 101 of the power converter 10, the inverter 104 and the booster 105) exceeds a predetermined threshold therefor to reach an overheated level (step S14).

In the case "No" in step S14, the hybrid controller 44 sets the AIS-activation-permission flag at "1: AIS-activation permitted" (step S15).

On the other hand, in the case of "No" in step S11 or S12 or "Yes" in step S13 or S14, the hybrid controller 44 sets the AIS-activation-permission flag at "0: AIS-activation disapproved" (step S16).

The hybrid controller 44 then sends the AIS-activation-permission flag set in step S15 or S16 to the vehicle-body controller 41 (step S17).

In short, the hybrid controller 44 sets the AIS-activation-permission flag at "1: AIS-activation permitted" when all the temperature sensors 131, 132, 136, 137, 141, 142 and 143 are in the normal operation and none of the hybrid devices, the temperatures of which are to be measured by these temperature sensors, is overheated. Otherwise, the hybrid controller 44 sets the flag at "0: AIS-activation disapproved".

In other words, only when the hybrid devices do not need to be cooled, the hybrid controller 44 sets the AIS-activation-permission flag at "1: AIS-activation permitted".

Figure 7:
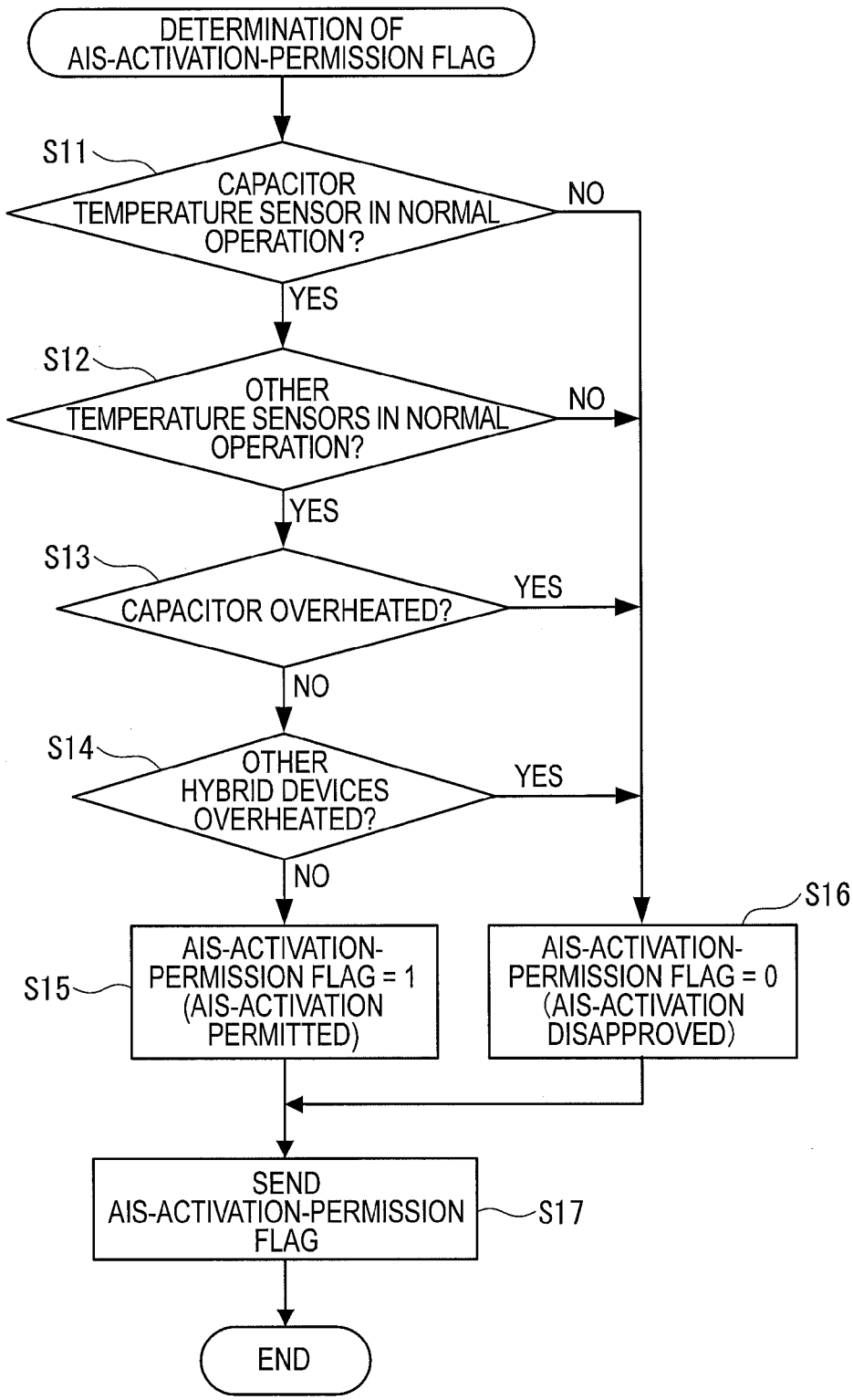
FIG. 7 is a flow chart showing a determination process for an AIS-activation-permission flag.

Incidentally, the hybrid controller 44 repeatedly performs the determination process for the AIS-activation-permission flag shown in FIG. 7 every predetermined cycle time. Therefore, since the vehicle-body controller 41 can obtain the AIS-activation-permission flag at a predetermined interval of time, when errors such as overheat of the hybrid devices and malfunction of the temperature sensors occur, the vehicle-body controller 41 can immediately obtain information on the errors.

AIS-Activation Control

Figure 8:
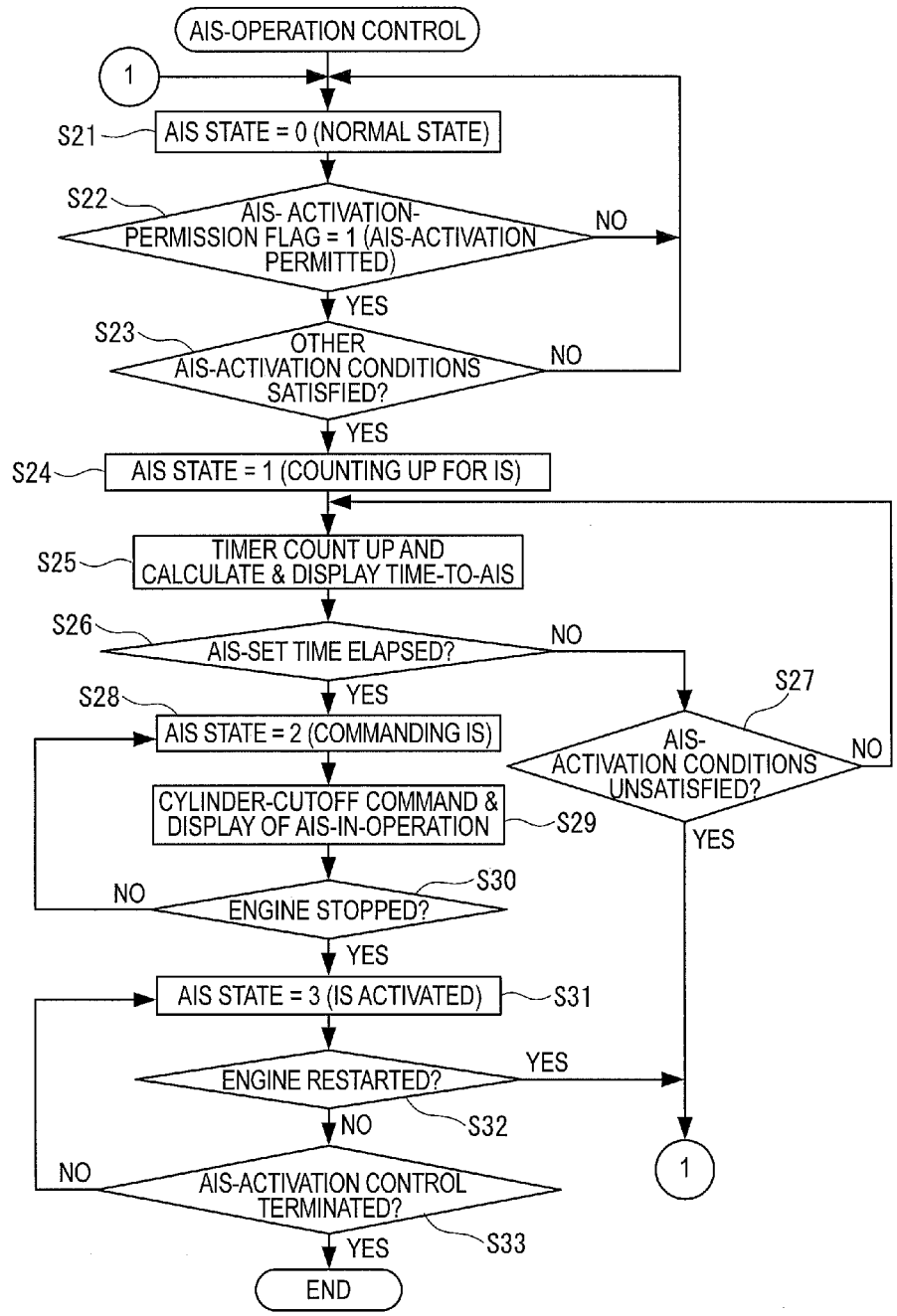
FIG. 8 is a flow chart showing an AIS-activation-control process.

Next, description will be made on an AIS-activation control performed by the vehicle-body controller 41 with reference to a flow chart shown in FIG. 8 and a graph shown in FIG. 9. Incidentally, FIG. 9 shows a change in the engine speed after the engine 4 is started until the engine 4 is stopped by the AIS operation.

Control when AIS State=0: Normal

Figure 9:
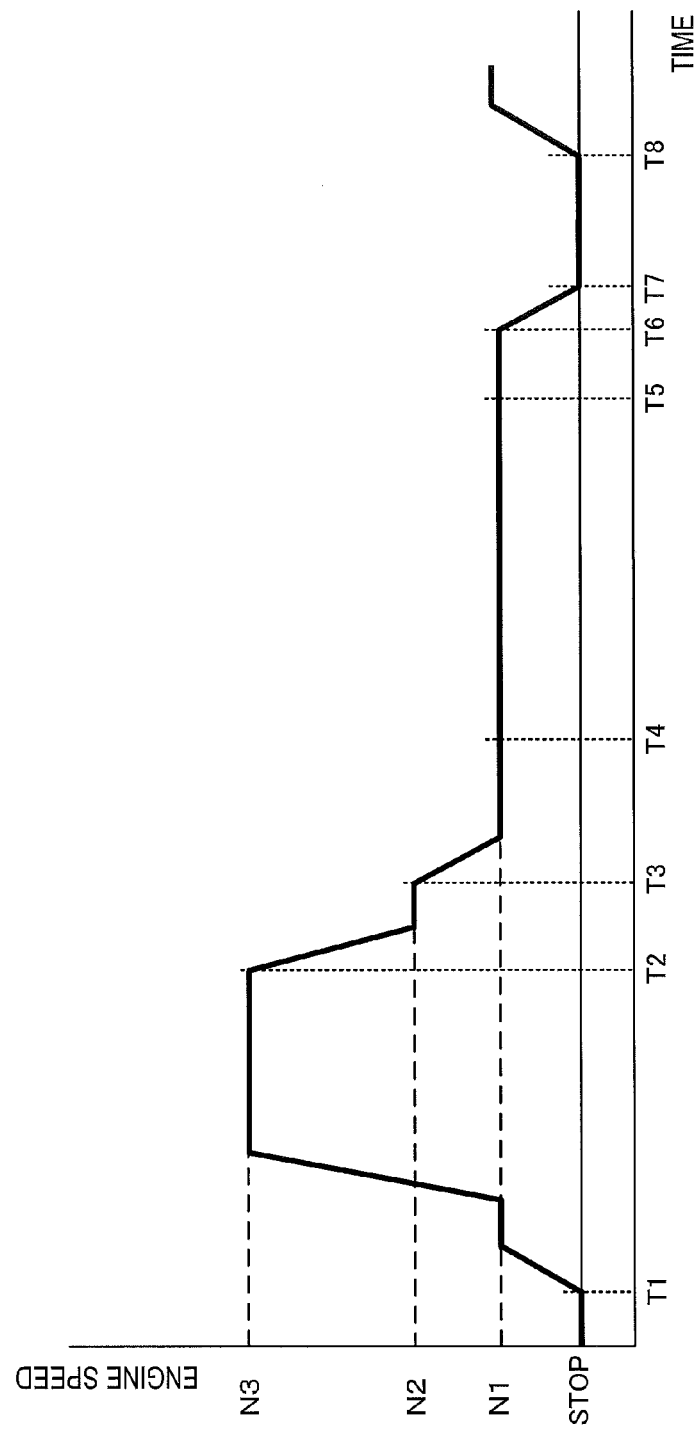
FIG. 9 is a graph showing a change in an engine speed during the AIS-activation control.

When the engine 4 is started at a time T1 in FIG. 9, the engine controller 42 increases the engine speed to a predetermined idle speed N1 and then keeps it. Further, the vehicle-body controller 41 starts the AIS-activation control as shown in FIG. 8. Since the AIS-activation conditions are not satisfied immediately after the start of the engine 4, the AIS-state determiner 411 of the vehicle-body controller 41 sets the AIS state at "0: normal" (step S21).

Next, the vehicle-body controller 41 determines whether or not the AIS-activation-permission flag sent from the hybrid controller 44 is "1" (i.e., the flag indicating "the operation is permitted" (step S22). In other words, the vehicle-body controller 41 determines whether or not the AIS-activation condition (7) is satisfied.

In the case of "Yes" in step S21, the vehicle-body controller 41 further determines whether or not the other AIS-activation conditions (1) to (6) and (8) to (14) are satisfied (step S23).

In the case of "No" in step S22 (i.e., when the temperature sensors for the hybrid devices malfunction or some of the hybrid devices are overheated), the vehicle-body controller 41 again performs the process in S21. Therefore, when at least the capacitor 12 is overheated, the AIS operation is prohibited, so that the cooling function for the capacitor 12 can be maintained. This results in prevention of a decrease in the capacitance of the capacitor 12 and shortening of the lifetime of the capacitor 12 due to a high temperature.

Similarly, when the hybrid devices other than the capacitor 12, such as the generator motor 5, the power converter 10 and the rotary-driving generator motor 11, are overheated, the AIS operation is prohibited, thereby maintaining the cooling function for the hybrid devices. This results in prevention of performance deterioration and shortening of the lifetimes of the hybrid devices.

Further, since the AIS-activation-permission flag is also set at "0 (disapproved)" to prohibit the AIS operation when the temperature sensors for the hybrid devices malfunction and may inaccurately measure the temperatures of the hybrid devices, the cooling functions for the hybrid devices can be maintained.

Likewise, in the case of "No" in step S23 (i.e., when the other AIS-activation conditions are not satisfied), the vehicle-body controller 41 also again performs the process in step S21. Therefore, when none of the AIS-activation conditions other than overheat of the hybrid devices and malfunction of the temperature sensors is satisfied (i.e., when auto-stop-prohibition conditions for the engine 4 are satisfied), the AIS activation is prohibited to avoid accidents resulting from the activation of AIS.

Incidentally, as long as an operator does not lock the PPC-lock lever 51 (i.e., a work is continued), the determination result is not "Yes" in step S23 (see the AIS-activation condition (14)). Therefore, the AIS-activation control is not performed against the intent of an operator, thereby preventing deterioration of the operability of the hybrid hydraulic excavator 1.

Change in Engine Speed from Start of Work Until Completion of Work

When an operator operates the operation lever for a work, the engine controller 42 increases the engine speed from N1 to N3 as shown in FIG. 9. Incidentally, the engine speed N3 for working varies depending on a load.

Subsequently, when the operator moves the operation lever back to an off-position (neutral position) at a time T2, the engine controller 42 decreases the engine speed. As shown in FIG. 9, since an auto-deceleration is activated, the engine controller 42 decreases the engine speed to a preset decelerated engine speed N2 and then keeps it. Subsequently, at a time 13 after the elapse of a preset time (e.g. four seconds) from the time T2, the engine controller 42 decreases the engine speed to the idle speed N1.

Control when AIS State=1: Counting Up for IS

Assuming that all the AIS-activation conditions (1) to (14) are satisfied at a time T4 in the graph of FIG. 9, the determination result is "Yes" in step S23 and thus the AIS-state determiner 411 of the vehicle-body controller 41 changes the AIS state to "1: counting up for IS" (step S24).

Incidentally, when the work is completed, all the conditions except the AIS condition (14) are normally likely to be satisfied, so that all the AIS-activation conditions are likely to be satisfied when an operator locks the PPC-lock lever 51.

Counting-Up by Idle Stop Timer

When the AIS-activation conditions are satisfied at the time T4, the vehicle-body controller 41 activates the idle stop timer 412 to start counting up (step S25). Incidentally, as long as the AIS state is not being counting up for IS, the idle stop timer 412 is maintained in an initial state with timer's count being cleared.

Simultaneously, the time-to-AIS calculator 413 calculates the time-to-AIS from the AIS-set time and a count value of the idle stop timer 412 (step S25).

Calculation of Time-to-AIS

When the AIS state is "normal" or "counting up for IS", the time-to-AIS calculator 413 calculates the time-to-AIS by subtracting idle stop timer's count from the AIS-set time.

For instance, when the AIS-set time is 300 seconds (five minutes) and the AIS state is "normal", the idle stop timer 412 does not start counting, and thus the count value is "0". As a result, as long as the AIS state is "normal", the time-to-AIS is kept at 300 seconds.

On the other hand, when the AIS state turns to "counting up for IS" at the time T4 in FIG. 9, the idle stop timer 412 starts counting, so that the time-to-AIS is counted down from 300 seconds while the count value is increased. For instance: when the count value of the idle stop timer 412 is 60 seconds (one minute), the time-to-AIS is 240 seconds (four minutes); when the count value is 120 seconds, the time-to-AIS is 180 seconds; and when the count value is 270 seconds, the time-to-AIS is 30 seconds. Incidentally, after the count value of the idle stop timer 412 becomes larger than the AIS-set time, the time-to-AIS is kept at zero seconds.

Similarly, when the AIS state is "commanding IS" or "IS activated", the time-to-AIS calculator 413 adjusts the time-to-AIS to "0", as described later.

Determination Whether or not AIS-Set Time Elapsed

The vehicle-body controller 41 determines whether or not the count value of the idle stop timer 412 exceeds the AIS-set time (step S26).

In the case of "No" in step S26, the vehicle-body controller 41 determines whether or not the AIS-activation conditions become unsatisfied (step S27).

In the case of "No" in step S27, the vehicle-body controller 41 again performs the process in step S26. Therefore, the time-to-AIS calculator 413 continues to calculate the time-to-AIS. Further, the vehicle-body controller 41 sends the calculated time-to-AIS to the monitor controller 43.

Display of Time-to-AIS

Figure 10:
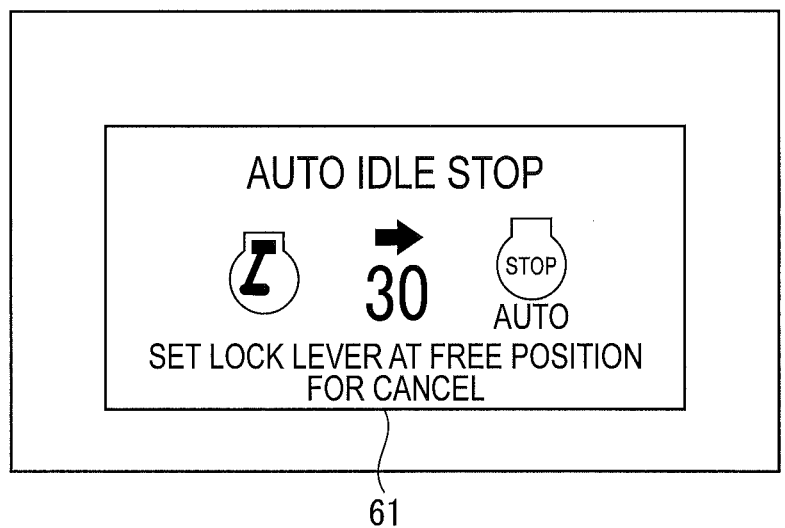
FIG. 10 shows a displayed image of a time-to-AIS.

The monitor controller 43 informs the operator of the time-to-AIS by, for instance, displaying the time-to-AIS on the monitor 46. Specifically, when the time-to-AIS becomes about 30 seconds, the monitor controller 43 alerts the operator with a beep. When the time-to-AIS becomes 30 seconds at the timing of a time T5 in FIG. 9, the monitor controller 43 opens a pop-up window 61 showing the time-to-AIS on the normal image of the monitor 46 as shown in FIG. 10 until the AIS state turns to "commanding IS" (step S25). The time-to-AIS shown by the pop-up window 61 is counted down from "30" to "0" by seconds.

Change from AIS State=1 to 0

When seeing the displayed image as shown in FIG. 10, the operator may move the PPC-lock lever 51 back to a free position from the lock position to cancel the activation of AIS in order to, for instance, restart a work. When the AIS-activation conditions thus become unsatisfied before the elapse of the AIS-set time, the result of the determination by the vehicle-body controller 41 is "Yes" in step S27.

In this case, the AIS-state determiner 411 of the vehicle-body controller 41 again performs the process in step S21 and changes the AIS state back to "0: normal". Subsequently, the AIS-activation-control process is restarted from step S22.

Control when AIS State=2: Commanding IS

On the other hands, when the result of the determination by the vehicle-body controller 41 is "Yes" in step S26, the AIS-state determiner 411 changes the AIS state to "2: commanding IS" (step S28). In FIG. 9, the AIS state turns to "commanding IS" at the timing of a time T6.

Cylinder-Cutoff Command

Subsequently, the cylinder-cutoff-command launcher 414 of the vehicle-body controller 41 outputs a command for cutting off all the cylinders to the engine controller 42 (step S29). In response to the cylinder-cutoff command, the engine controller 42 stops the engine 4.

Further, the monitor controller 43 opens a pop-up window 62 on the normal image of the monitor 46 to inform that AIS is in operation but electric power is unnecessarily consumed (e.g., it is invited to turn off devices such as an air conditioner).

Next, the vehicle-body controller 41 ascertains whether or not the engine 4 is stopped (step S30). Specifically, when it is ascertained that the engine 4 is stopped, the engine controller 42 sends TRUE for an engine-stop state to the vehicle-body controller 41. Therefore, as long as the engine-stop state=TRUE is not received from the engine controller 42, the result of the determination by the vehicle-body controller 41 is "No" in step S30 and thus the vehicle-body controller 41 repeatedly performs the processes in steps S28 and S29.

Control when AIS State=3: IS Activated

On the other hand, when the engine 4 is stopped at the timing of a time T7 in FIG. 9 and the engine-stop state=TRUE is received from the engine controller 42, the result of the determination by the vehicle-body controller 41 is "Yes" in step S30. The AIS-state determiner 411 then changes the AIS state to "3: IS activated" (step S31).

Figure 11:
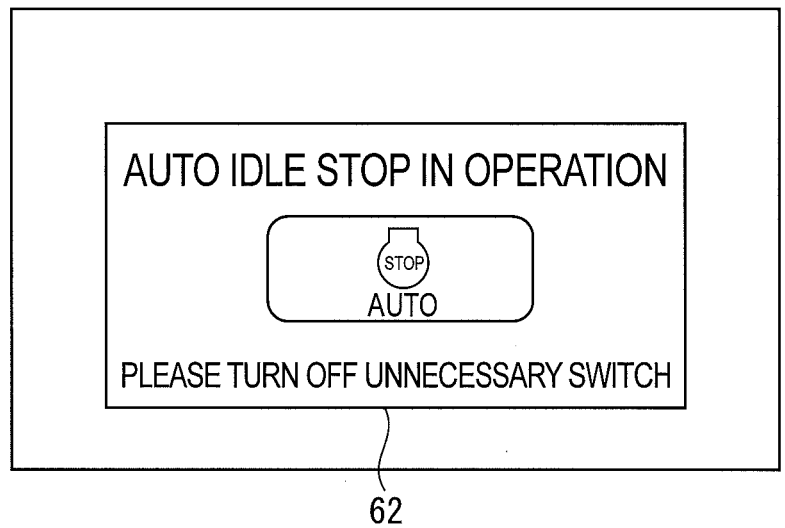
FIG. 11 shows a displayed image of AIS-in-operation.

Even after the engine 4 is stopped at the timing of the time T7 in FIG. 9, the monitor controller 43 lets the monitor 46 continuously show that IS is activated as shown in FIG. 11.

Restart of Engine

Next, the vehicle-body controller 41 determines whether or not an operator restarts the engine 4 by turning the key on while IS is activated (step S32).

When the engine 4 is restarted, the engine controller 42 sends FALSE for the engine-stop state to the vehicle-body controller 41. When the engine-stop state turns to FALSE, the result of the determination by the vehicle-body controller 41 is "Yes" in step S32. Subsequently, the process returns to step S21, and the AIS-state determiner 411 changes the AIS state to "0: normal state" and continues the AIS-activation control.

Determination of Termination of AIS-Activation Control

For instance, when the key is pulled out while the engine is stopped, the vehicle-body controller 41 determines whether or not conditions for terminating the AIS-activation control are satisfied (step S33). In the case of "No" in step S33, the process returns to step S31 and the vehicle-body controller 41 continues the AIS-activation control.

On the other hand, in the case of "Yes" in step S33, the vehicle-body controller 41 terminates the AIS-activation control. Afterwards, when the key is again turned on, the vehicle-body controller 41 restarts the process from step S21.

The vehicle-body controller 41 repeats the above-described processes in step S21 to S33 even after the engine is restarted to perform the AIS-activation control.

In conclusion, when the control is performed as shown in FIG. 9 as described above, the AIS state is changed depending on time as follows: "0: normal state" for times T1 to T4; "1: counting up for IS" for times T4 to T6; "2: commanding IS" for times T6 to T7; "3: IS activated" for times T7 to T8; and "0: normal state" for time T8 and thereafter.

It should be understood that the scope of the invention is not limited to the above-described exemplary embodiment, but includes modifications and improvements as long as the modifications and improvements are compatible with the invention.

In the above exemplary embodiment, after the AIS-activation conditions are satisfied, the AIS state is changed to being counting up for IS and issuance of the cylinder-cutoff command is suspended until the elapse of the AIS-set time. However, issuance of the cylinder-cutoff command may be commanded immediately after the AIS-activation conditions are satisfied. In other words, the AIS state may be changed directly from "normal state" to the "commanding IS" not via "counting up for IS".

Further, regarding the determination of the AIS-activation-permission flag, as long as at least the temperature of the capacitor 12 exceeds the threshold, the activation may be disapproved irrespective of whether or not the temperatures of all the hybrid devices are lower than the thresholds. In other words, although the AIS-activation-permission flag is set for disapproving the activation when the temperature of one of the generator motor 5, the rotary-driving generator motor 11 and the power converter 10 exceeds the threshold in the exemplary embodiment, the determination may alternatively be made by, for instance, measuring the temperature of only the power converter 10 irrespective of the temperatures of the generator motor 5 and the rotary-driving generator motor 11.

Further, when it can be determined whether or not the capacitor 12 and the other hybrid devices are overheated depending on characteristics other than temperature such as current value, voltage value and resistance, such characteristic values may be measured to determine whether or not the devices are overheated.

Although the hybrid controller 44 is provided with the overheat determiner 441 that performs the determination of the AIS-activation-permission flag depending on whether or not the hybrid devices are overheated or the temperature sensors malfunction in the above exemplary embodiment, the vehicle-body controller 41 or the like may alternatively be provided with the overheat determiner 441. In other words, the overheat determiner 441 and the cylinder-cutoff-command launcher (an auto-stop controller for the engine 4) 414 may be provided to separate controllers such as the hybrid controller 44 and the vehicle-body controller 41, or, alternatively, may be provided to the same controller such as the vehicle-body controller 41.

Although the elements such as the AIS-state determiner 411, the idle stop timer 412, the time-to-AIS calculator 413 and the cylinder-cutoff-command launcher 414 are provided to the vehicle-body controller 41, these elements may be provided to another controller such as the engine controller 42. Further, the respective functions of the vehicle-body controller 41, the engine controller 42 and the hybrid controller 44 may be performed by a single controller. In other words, a controller for the AIS-activation control may have an arrangement different from the arrangement according to the above exemplary embodiment.

The invention claimed is:

1. A hybrid work machine comprising:
    an engine;
    a generator motor;
    a capacitor being configured to store electric power generated by the generator motor;
    a cooling system being configured to cool the capacitor, the cooling system comprising:
        a circulation mechanism being configured to circulate a refrigerant through the capacitor; and
        a cooler being configured to cool the refrigerant with output from the engine; and
    a controller being configured to determine whether or not the capacitor is overheated to control auto-stop of the engine, the controller prohibiting the auto-stop of the engine when it is determined that the capacitor is overheated.

2. The hybrid work machine according to claim 1, further comprising a capacitor-temperature sensor being configured to measure a temperature of the capacitor, wherein
    when the temperature of the capacitor measured by the capacitor-temperature sensor is equal to or higher than a threshold for determining that the capacitor is overheated, the controller prohibits the auto-stop of the engine.

3. The hybrid work machine according to claim 1, further comprising:
   hybrid devices comprising at least the generator motor and the capacitor; and
   a temperature sensor being configured to measure temperatures of the hybrid devices, wherein
   when the temperature of any one of the hybrid devices is equal to or higher than a threshold for determining that the one of the hybrid devices is overheated, the controller prohibits the auto-stop of the engine.

4. The hybrid work machine according to claim 1, further comprising:
   a carrier;
   a rotary body being rotatable relative to the carrier by a rotary-driving generator motor;
   a power converter being configured to drive at least one of the generator motor and the rotary-driving generator motor with the electric power stored by the capacitor, the electric power being generated by at least one of the generator motor and the rotary-driving generator motor; and
   at least one of a generator-motor-temperature sensor being configured to measure a temperature of the generator motor, a power-converter-temperature sensor being configured to measure a temperature of the power converter, and a rotary-driving-generator-motor-temperature sensor being configured to measure a temperature of the rotary-driving generator motor, wherein
   when the temperature of any one of the generator motor, the power converter and the rotary-driving generator motor measured by the temperature sensor is equal to or higher than a threshold for determining that the one of the generator motor, the power converter and the rotary-driving generator motor is overheated, the controller prohibits the auto-stop of the engine.

5. The hybrid work machine according to claim 1, wherein
   the capacitor comprises:
   a capacitor cell;
   a cooling base being configured to cool the capacitor cell; and
   a conductive wire being electrically connected to an electrode of the capacitor cell,
   a capacitor-temperature sensor is provided to measure a temperature of the capacitor, the capacitor-temperature sensor comprising a first temperature sensor being configured to measure a temperature of the cooling base and a second temperature sensor being configured to measure a temperature of the conductive wire, and
   the controller calculates the temperature of the capacitor based on the temperatures measured by the first temperature sensor and the second temperature sensor.

6. The hybrid work machine according to claim 1, wherein
   the controller determines that an auto-stop condition for the engine is satisfied when the temperature of the device measured by the temperature sensor is lower than the threshold for determining that the device is overheated and when a preset auto-stop-prohibition condition for the engine other than the temperature of the device is unsatisfied, and performs a control for stopping the engine when the auto-stop condition for the engine is kept satisfied until an elapse of a predetermined duration of time from the determination that the auto-stop condition for the engine is satisfied.

7. A method of controlling an engine-auto-stop for a hybrid work machine, the hybrid work machine comprising:
   an engine;
   a generator motor;
   a capacitor being configured to store electric power generated by the generator motor; and
   a cooling system being configured to cool the capacitor, the cooling system comprising:
     a circulation mechanism being configured to circulate a refrigerant through the capacitor; and
     a cooler being configured to cool the refrigerant with output from the engine, the method comprising prohibiting auto-stop of the engine when it is determined that the capacitor is overheated.

8. The method of controlling the engine-auto-stop for the hybrid work machine according to claim 7, wherein the hybrid work machine further comprises a capacitor-temperature sensor being configured to measure a temperature of the capacitor, the method further comprising:
   determining that an auto-stop condition for the engine is satisfied when the temperature measured by the capacitor-temperature sensor is lower than a threshold for determining that the capacitor is overheated and when a preset auto-stop-prohibition condition for the engine other than the temperature of the capacitor is unsatisfied; and
   performing a control for stopping the engine when the auto-stop condition for the engine is kept satisfied until an elapse of a predetermined duration of time from the determination that the auto-stop condition for the engine is satisfied.

* * * * *